United States Patent

Takizawa et al.

[11] Patent Number: 5,932,488
[45] Date of Patent: Aug. 3, 1999

[54] METHOD OF DRY ETCHING

[75] Inventors: Toru Takizawa, Fuchu; Kathuhiko Nishiwaki, Toyoda, both of Japan

[73] Assignee: Citizen Watch Co., Ltd., Tokyo, Japan

[21] Appl. No.: 08/796,837

[22] Filed: Feb. 7, 1997

[30] Foreign Application Priority Data

| Feb. 9, 1996 | [JP] | Japan | 8-023704 |
| Apr. 12, 1996 | [JP] | Japan | 8-090739 |
| Oct. 17, 1996 | [JP] | Japan | 8-274458 |

[51] Int. Cl.$^6$ .................................................. C03C 15/00
[52] U.S. Cl. ...................... 438/714; 438/726; 438/728; 438/732; 216/69; 216/72
[58] Field of Search ................................ 438/714, 726, 438/728, 732, 734, 735; 216/67, 69, 70, 72

[56] References Cited

U.S. PATENT DOCUMENTS

| 5,336,365 | 8/1994 | Goda et al. | 156/643 |
| 5,441,599 | 8/1995 | Reinhardt | 156/646.1 |
| 5,644,153 | 7/1997 | Keller | 257/324 |

*Primary Examiner*—Bruce Breneman
*Assistant Examiner*—Luz Alejandro
*Attorney, Agent, or Firm*—Armstrong, Westerman Hattori, McLeland & Naughton

[57] ABSTRACT

A dry etching method utilizing electron cyclotron resonance excited by microwaves is divided into at least a first etching step for etching a region which extends to the vicinity of a boundary between the non-etching layer and the etching layer but does not reach the non-etching layer and a second etching step conducted after the first etching step.

At least one among the four control factors of output power of the magnetron, electron cyclotron resonance point, etching pressure and magnetic field intensity distribution or a combination of five control factors including the foregoing four plus a high-frequency bias power applied to the rear surface of the object to be etched is changed as desired between the first etching step and the second etching step.

28 Claims, 5 Drawing Sheets

METHOD OF DRY ETCHING

BACKGROUND OF THE INVENTION

1. Field of the Invention

This invention relates to a dry etching method used in a process for manufacturing semiconductor integrated circuits, more particularly to a dry etching method utilizing electron cyclotron resonance excited by microwaves for forming a relief pattern or a recessed pattern in an etching film.

2. Description of the Related Art

In forming semiconductor integrated circuits on silicon substrates, the pattern feature size is desirably reduced in order to increase speed performance and lower production cost. The need for finer pattern features is particularly great in connection with MOS transistor gates and contact hole wiring and etching or bipolar transistor contact hole wiring and etching. The development of an etching method enabling stable formation of fine patterns with high precision is therefore been desired.

FIG. 1 shows an example of the configuration of an ECR etching machine using electron cyclotron resonance (ECR) excited by microwaves.

As shown in this figure, this type of ECR etching machine has a sample stage 35 disposed inside a treatment chamber 30 sealed by an etching chamber 31 and a discharge tube 33. The discharge tube 33 is made of quartz material. The sample stage 35 also serves as a lower electrode connected to a high-frequency power source 29. The object to be etched is placed on the sample stage 35.

The etching chamber 31 is connected with an exhauster 39 and an etching gas source 37. During etching, the treatment chamber 30 is exhausted by the exhauster 39, etching gas is then supplied into the treatment chamber 30 from the etching gas source 37, and the exhauster 39 regulates the pressure (the etching pressure) in the treatment chamber 30 to a constant value.

After the etching pressure of the treatment chamber 30 has been regulated to a constant value, a magnetron 41 is operated to generate microwaves at a frequency of, for example, 2.45 GHz and the microwaves are guided to the discharge tube 33 by a waveguide 43.

A pair of vertically separated solenoid coils (upper coil 45 and lower coil 47) is provided around the discharge tube 33. The upper coil 45 and the lower coil 47 produce a magnetic field inside the discharge tube 33 (in the treatment chamber 30).

It is known that when the frequency of the microwave guided to the discharge tube 33 is 2.45 GHz, electron cyclotron resonance (ECR) occurs at the point where the magnetic flux density of the magnetic field produced by the upper and lower coils 45 and 47 is 875 Gauss (G). This point is generally known as the "ECR point."

When plasma is formed in the treatment chamber 30 after the occurrence of electron cyclotron resonance and a high-frequency bias power (RF bias power) is applied to the lower electrode (sample stage 35) by the high-frequency power source 29, ions bombard the etching film of the semiconductor substrate thereby etching it.

Since this etching uses high-density plasma produced by electron cyclotron resonance, the ratio of isotropic etching by radicals without directivity is low while the ratio of anisotropic etching, i.e., etching by ions with directivity striking the etching film, is high.

The etching pressure is therefore lowered to promote disassociation of the etching gas and thereby raise the ion density and lengthen the ion mean free path. This is aimed at enabling the etching film to be etched without side etching or undercutting.

In the aforementioned ECR etching machine, the ECR point can be regulated by controlling the currents passed through the upper coil 45 and the lower coil 47. The intensity distribution of the magnetic field (called the "magnetic field intensity distribution" hereinafter) from the ECR point to the semiconductor substrate can also be regulated by controlling the current passed through the upper coil 45 and the lower coil 47. The range over which the ions generated in the treatment chamber 30 can move without colliding with other particles (the mean free path) can be regulated by using the exhauster 39 to control the etching pressure. The energy of the ions generated in the treatment chamber 30 and the number of ions striking the etching film can be regulated by controlling the RF bias power applied to the lower electrode (the sample stage 35) by the high-frequency power source 29. The directivity of the ions in the treatment chamber 30 can be regulated by controlling either the RF bias power or the magnetic field intensity distribution.

In the conventional dry etching method using this type of ECR etching machine, once the ECR point, magnetic field intensity distribution, etching pressure and the output of the magnetron 41 (microwave intensity) have been appropriately set for the object to be etched, they are maintained constant until the series of etching steps have been completed. In other words, these control factors are not changed in the course of the etching process.

The exception is the RF bias power, which has sometimes been varied during etching.

Conventional dry etching methods of this type are used for two types of semiconductor substrate patterning: relief patterning and recessed patterning. Relief patterning is a patterning mode in which, as in the case of forming a MOS transistor gate, the peripheral region of a circuit element portion is etched and the circuit element portion itself is not. Recessed patterning is a patterning mode in which, as in the case of forming a MOS transistor contact hole, the circuit element portion is etched to remove it from the surrounding material.

FIGS. 6 and 7 are sectional views showing the etched state of a relief pattern formed by a conventional dry etching method of this type, specifically the etched state of gates of a MOS transistor formed on a semiconductor substrate. FIG. 6 shows the etched state of gates formed at the middle of the semiconductor substrate and FIG. 7 shows the etched state of gates formed near the edge of the semiconductor substrate.

The procedures used to form the gates shown in these figures is as follows. A gate insulating film 13 consisting of a silicon dioxide film is formed on a semiconductor substrate 11. A gate material 15 constituted as a polycrystalline silicon film is formed as an etching film on the gate insulating film 13. A film of photosensitive resin (photoresist) 17 is formed on the upper surface of the gate material 15, whereafter the photosensitive resin 17 is patterned by exposure and development. The gate material 15 is etched by the dry etching method using the aforesaid ECR etching machine with the patterned photosensitive resin 17 used as an etching mask. The gate material 15 remaining on the semiconductor substrate 11 after etching constitutes the gates.

FIGS. 8 and 9 are sectional views showing the etched state of a recessed pattern formed by a conventional dry etching method of this type, specifically the etched state of contact holes of a MOS transistor formed on a semiconductor substrate. FIG. 8 shows the etched state of contact holes formed in the middle of the semiconductor substrate and FIG. 9 shows the etched state of contact holes formed in near the edge of the semiconductor substrate.

The procedure used to form the contact holes 20 shown in these figures is as follows. An interlayer dielectric thin film 23 consisting of a silicon oxide film containing phosphorus and boron is formed on a semiconductor substrate 11 as an etching film. A film of photosensitive resin 17 is formed on the upper surface of the interlayer dielectric thin film 23, whereafter the photosensitive resin 17 is patterned by exposure and development. The contact holes 20 are etched in the interlayer dielectric thin film 23 by the dry etching method using the aforesaid ECR etching machine with the patterned photosensitive resin 17 used as an etching mask. The contact holes 20 are thus formed.

In the conventional dry etching method using the aforesaid ECR etching machine, however, the etching of the etching film consisting of the gate material 15 or the interlayer dielectric thin film 23 may result in different etched sectional shapes between the middle of the semiconductor substrate 11 (FIGS. 6 and 8) and the peripheral portions (FIGS. 7 and 9).

In the etching method employing electron cyclotron resonance, the ions which effect the etching are restricted in direction of movement by and travel along the magnetic lines of force in the magnetic field. In the conventional etching method, the etching uniformity has therefore been enhanced by positioning the ECR point at a distance from the semiconductor substrate 11 and broadening the magnetic filed, thereby dispersing the plasma and preventing nonuniformity of the plasma at the ECR point from affecting the etching.

As a result, the magnetic lines of force are perpendicular to the semiconductor substrate 11 surface at the middle of the semiconductor substrate 11 but intersect obliquely with the surface of the semiconductor substrate 11 at the peripheral regions of the semiconductor substrate 11. The etching is effected by ions that travel along these magnetic lines of force and impinge on the etching film.

Since the magnetic lines of force intersect the surface of the semiconductor substrate 11 in both perpendicular and oblique directions, the etching is perpendicular at the middle region of the semiconductor substrate 11 but is skewed in the peripheral regions.

Moreover, in the conventional etching method using electron cyclotron resonance, the RF bias power produced by the high-frequency power source 29 is normally set high in order to promote etching of the etching film. As a result, the gate insulating film 13 and the semiconductor substrate 11 which are desirably left as they are without etching are also apt to undergo deep local etching.

SUMMARY OF THE INVENTION

An object of this invention is to overcome the aforesaid problems by enabling formation of etched features of uniform shape at both the middle and peripheral regions of the etched object.

Another object of this invention is to prevent the problem of deep local etching of the gate insulating film, the semiconductor substrate and other non-etching layers where no etching is required, thereby ensuring etching of high quality.

In order to achieve these objects, this invention provides a new method of dry etching using electron cyclotron resonance excited by microwaves.

Specifically, an object to be etched consisting of a layer not requiring etching (non-etching layer) and a layer requiring etching (etching layer) formed on the non-etching layer is placed in a sealed treatment chamber.

Etching gas is supplied into the treatment chamber, the pressure of the treatment chamber is controlled, plasma is generated in the treatment chamber by use of microwaves, and electron cyclotron resonance is produced by synergistic interaction between a magnetic field and the microwaves. A high-frequency bias power is applied to the rear surface of the object to be etched and the front surface of the object is progressively etched in this state.

In this dry etching method using electron cyclotron resonance excited by microwaves, the present invention establishes at least a first etching step for etching a region which extends to the vicinity of the boundary between a non-etching layer and an etching layer but does not reach the non-etching layer and a separate second etching step conducted after the first etching step and conducts one of the following operations:

(1) Changing the output power of the magnetron (intensity of the microwaves) between the first etching step and the second etching step.

(2) Changing the electron cyclotron resonance point between the first etching step and the second etching step.

(3) Changing the magnetic field intensity distribution from the electron cyclotron resonance point to the object to be etched between the first etching step and the second etching step.

(4) Changing the output power of the magnetron and the electron cyclotron resonance point between the first etching step and the second etching step.

(5) Changing the output power of the magnetron and the magnetic field intensity distribution from the electron cyclotron resonance point to the object to be etched between the first etching step and the second etching step.

(6) Changing the electron cyclotron resonance point and the magnetic field intensity distribution from the electron cyclotron resonance point to the object to be etched between the first etching step and the second etching step.

(7) Changing the output power of the magnetron, the electron cyclotron resonance point and the magnetic field intensity distribution from the electron cyclotron resonance point to the object to be etched between the first etching step and the second etching step.

(8) Changing the pressure of the treatment chamber between the first etching step and the second etching step.

(9) Changing the pressure of the treatment chamber and the high-frequency bias power applied to the rear surface of the object to be etched between the first etching step and the second etching step.

(10) Changing the output power of the magnetron and the pressure in the treatment chamber between the first etching step and the second etching step.

(11) Changing the output power of the magnetron and the high-frequency bias power applied to the rear surface of the object to be etched between the first etching step and the second etching step.

(12) Changing the output power of the magnetron, the pressure of the treatment chamber and the high-frequency bias power applied to the rear surface of the object to be etched between the first etching step and the second etching step.

(13) Changing the electron cyclotron resonance point and the pressure of the treatment chamber between the first etching step and the second etching step.

(14) Changing the electron cyclotron resonance point and the high-frequency bias power applied to the rear surface of the object to be etched between the first etching step and the second etching step.

(15) Changing electron cyclotron resonance point, the high-frequency bias power applied to the rear surface of the object being etched and the pressure of the treatment chamber between the first etching step and the second etching step.

(16) Changing the magnetic field intensity distribution from the electron cyclotron resonance point to the object to be etched and the pressure of the treatment chamber between the first etching step and the second etching step.

(17) Changing the magnetic field intensity distribution from the electron cyclotron resonance point to the object to be etched and the high-frequency bias power applied to the rear surface of the object to be etched between the first etching step and the second etching step.

(18) Changing the magnetic field intensity distribution from the electron cyclotron resonance point to the object to be etched, the high-frequency bias power applied to the rear surface of the object to be etched and the pressure of the treatment chamber between the first etching step and the second etching step.

(19) Changing the output power of the magnetron, the pressure of the treatment chamber and the electron cyclotron resonance point between the first etching step and the second etching step.

(20) Changing the output power of the magnetron, the high-frequency bias power applied to the rear surface of the object to be etched and the electron cyclotron resonance point between the first etching step and the second etching step.

(21) Changing the output power of the magnetron, the high-frequency bias power applied to the rear surface of the object to be etched, the electron cyclotron resonance point and the pressure of the treatment chamber between the first etching step and the second etching step.

(22) Changing the output power of the magnetron, the pressure of the treatment chamber and the magnetic field intensity distribution from the electron cyclotron resonance point to the object to be etched between the first etching step and the second etching step.

(23) Changing the output power of the magnetron, the high-frequency bias power applied to the rear surface of the object to be etched and the magnetic field intensity distribution from the electron cyclotron resonance point to the object to be etched between the first etching step and the second etching step.

(24) Changing the output power of the magnetron, the pressure of the treatment chamber and the magnetic field intensity distribution from the electron cyclotron resonance point to the object to be etched between the first etching step and the second etching step.

(25) Changing the electron cyclotron resonance point, the pressure of the treatment chamber, the magnetic field intensity distribution from the electron cyclotron resonance point to the object to be etched and the high-frequency bias power applied to the rear surface of the object to be etched between the first etching step and the second etching step.

(26) Changing the electron cyclotron resonance point, the high-frequency bias power applied to the rear surface of the object to be etched and the magnetic field intensity distribution from electron cyclotron resonance point to the object to be etched between the first etching step and the second etching step.

(27) Changing the electron cyclotron resonance point, the high-frequency bias power applied to the rear surface of the object to be etched, the pressure of the treatment chamber and the magnetic field intensity distribution from the electron cyclotron resonance point to the object to be etched between the first etching step and the second etching step.

(28) Changing the output power of the magnetron, the pressure of the treatment chamber, the electron cyclotron resonance point and the magnetic field intensity distribution from the electron cyclotron resonance point to the object being etched between the first etching step and the second etching step.

(29) Changing the output power of the magnetron, the high-frequency bias power applied to the rear surface of the object to be etched, the electron cyclotron resonance point and the magnetic field intensity distribution from the electron cyclotron resonance point to the object to be etched between the first etching step and the second etching step.

(30) Changing the output power of the magnetron, the high-frequency bias power applied to the rear surface of the object to be etched, the electron cyclotron resonance point, the magnetic field intensity distribution from the electron cyclotron resonance point to the object to be etched and the pressure of the treatment chamber between the first etching step and the second etching step.

Thus in the invention dry etching method, the output power of the magnetron is changed between the first etching step and the second etching step. Changing the output power of the magnetron changes the degree of disassociation of the etching gas.

In the first etching step, the RF bias power and the output power of the magnetron are preferably kept low. Since this increases the ratio of anisotropic etching by the ions, it enables etching of fine features with high stability.

In the second etching step, the output power of the magnetron is increased to raise the density of the plasma generated in the treatment chamber. Raising the plasma density moderates the nonuniformity of the plasma density, which improves the etching uniformity.

Raising the plasma density also causes anisotropic etching by ions and isotropic etching by radicals to occur in parallel. Since increasing the output power of the magnetron promotes radical and ion disassociation, moreover, the isotropic etching component increases even under application of the RF bias power by the high-frequency power source.

As a result, etched features of uniform shape can be formed at both the middle and peripheral regions of the etched object and deep local etching of the gate insulating film, the semiconductor substrate and other non-etching layers where no etching is required can be prevented.

In the invention dry etching method, the electron cyclotron resonance point (ECR point) is changed between the first etching step and the second etching step.

In the first etching step, the ECR point is preferably positioned near the object to be etched. Since this eliminates the difference in the direction of the magnetic lines of force at the front surface of the object to be etched between the middle region and the peripheral regions of the object to be etched, the magnetic lines are perpendicular to the front surface of the object to be etched. The middle region and peripheral regions of the object to be etched can therefore both be uniformly etched.

Positioning the ECR point near the object to be etched also reduces ion scatter and enhances ion directivity. As a result, anisotropic etching of the etching layer is possible even when the RF bias power is lowered.

In the second etching step, the ECR point is preferably positioned at a distance from the object to be etched. When it is, the plasma in the treatment chamber disperses. As this moderates the nonuniformity of the plasma density, the uniformity of the etching improves.

Additionally lowering the RF bias power increases the isotropic etching by radicals. As result, etching as far as the gate insulating film, the semiconductor substrate and other non-etching layers where no etching is required can be prevented.

In the invention dry etching method, the magnetic field intensity distribution from the electron cyclotron resonance point to the object to be etched is changed between the first etching step and the second etching step. The incidence angle of the ions can be controlled by varying the magnetic field intensity distribution.

In the first etching step, the magnetic field intensity distribution is preferably made uniform so that the magnetic lines of force are substantially perpendicular to the surface of the object to be etched. Since under this condition the directivity of the ions is substantially perpendicular to the surface of the object to be etched, etching with high anisotropy is possible even if the RF bias power is lowered.

In the second etching step, the magnetic field intensity is preferably varied between positions near and far from the object to be etched. This disperses the plasma and moderates the nonuniformity of the plasma density. As a result, etching uniformity improves.

Moreover, establishing a difference in magnetic field intensity between positions near and far from the object to be etched under a condition of reduced RF bias power increases the isotropic etching component. This prevents the problem of etching to as far as the non-etching layers.

In the invention dry etching method, the etching pressure of the treatment chamber is changed between the first etching step and the second etching step. Since varying the etching pressure varies the degree of disassociation of the etching gas, it enables variation of the mean free path of the ions.

In the first etching step it is further preferable to keep the etching pressure low under condition of reduced RF bias power so as to heighten the anisotropic etching by the ions and achieve stronger anisotropic etching. This enables stable etching of fine features.

In the second etching step, the etching pressure is elevated. Since elevating the etching pressure increase the radical component in the treatment chamber, it moderates the nonuniformity of the plasma density, thereby improving etching uniformity.

Raising the etching pressure increases the ratio of isotropic etching even under application of RF bias power. It therefore prevents the problem of etching to as far as the non-etching layers.

In the invention dry etching method, the output power of the magnetron, the ECR point, the magnetic field intensity distribution, the etching pressure and the RF bias power can be changed in various combinations between the first etching step and the second etching step. Since the individual operations explained in the foregoing produce a synergistic effect when combined, even more effective formation of etched features of uniform shape at both the middle and peripheral regions of the etched object can be achieved and the problem of etching to as far as the non-etching layers can be more thoroughly prevented. As a result, the quality of the etching can be further enhanced. Moreover, since etching with strong anisotropy can be achieved with respect to the etching layer, etching of fine features can effected stably.

The above and other objects, features and advantages of the invention will be apparent from the following detailed description which is to be read in conjunction with the accompanying drawings.

DETAILED DESCRIPTION OF THE PREFERRED EMBODIMENTS

Embodiments of the invention will now be explained with reference to the drawings.

The general production process for a MOS transistor will first be explained with reference to FIGS. 2 to 5.

Figure 2:
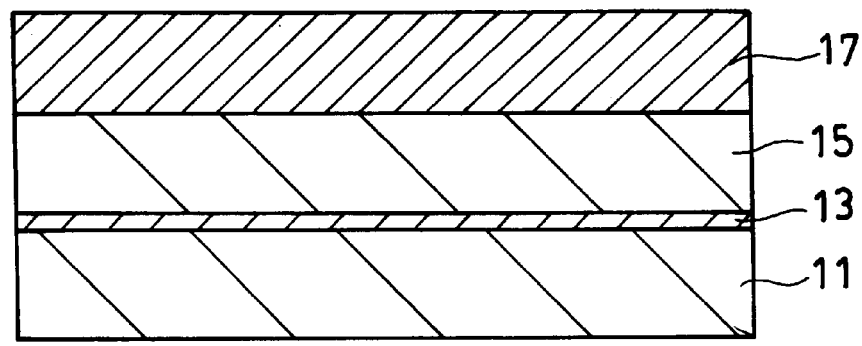
FIG. 2 is a sectional view for explaining a step in the production of a MOS transistor in an embodiment of this invention.

As shown in FIG. 2, a semiconductor substrate 11 is placed in a mixed gas atmosphere of oxygen and nitrogen and subjected to oxidation processing. This oxidation processing forms a gate insulating film 13 of silicon dioxide to a thickness of 20 nm on the surface of the semiconductor substrate 11. A gate material 15 of polycrystalline silicon is formed to a thickness of 350 nm over the whole front surface of the semiconductor substrate 11 by chemical vapor deposition employing monosilane as the reactive gas. Next, the entire front surface of the semiconductor substrate 11 is spin-coated with photosensitive resin 17. The photosensitive resin 17 is exposed through a prescribed photomask and developed to pattern it in the shape of gates.

Figure 1:
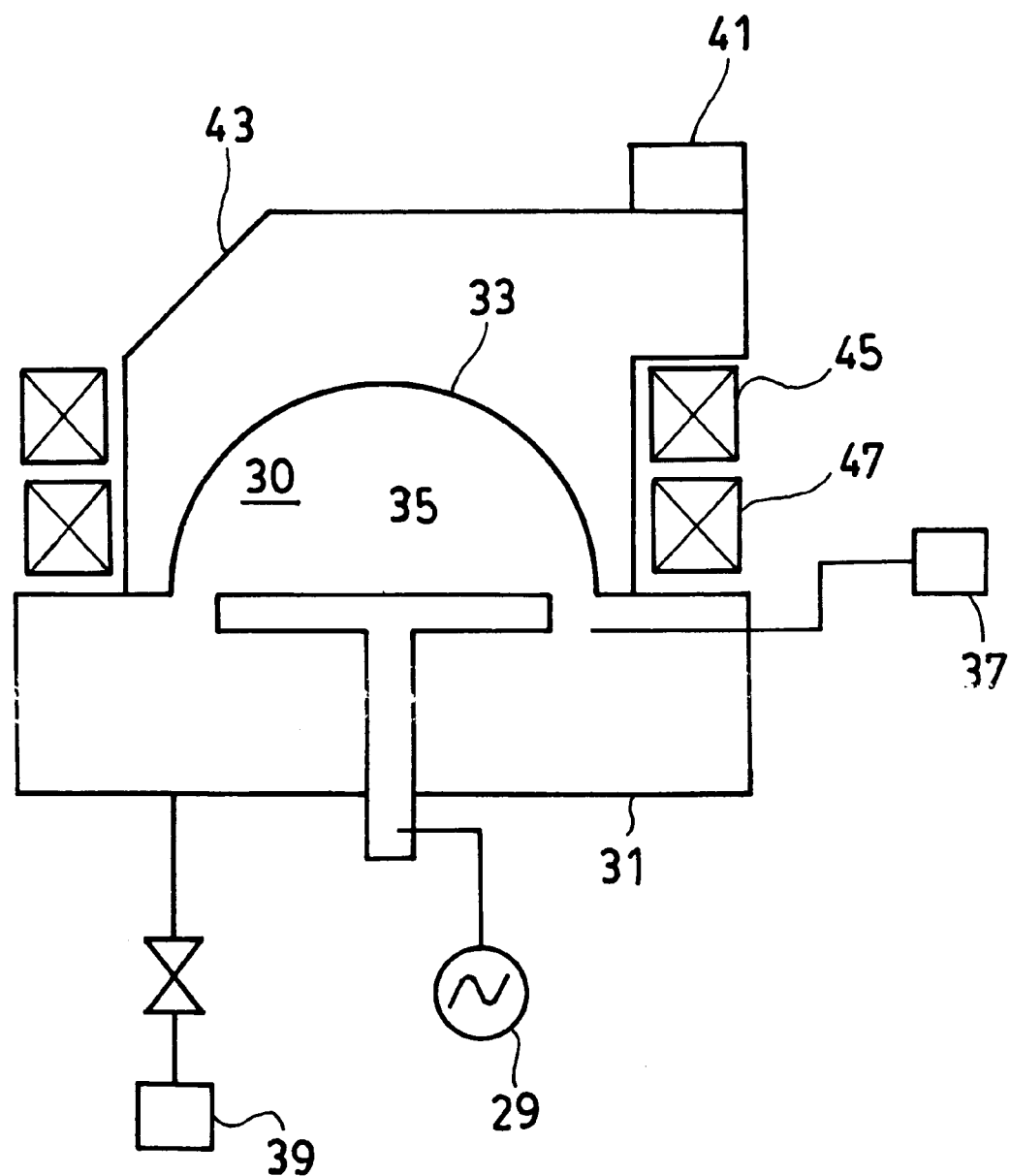
FIG. 1 is a schematic diagram of an ECR etching machine used in an embodiment of this invention.
Figure 3:
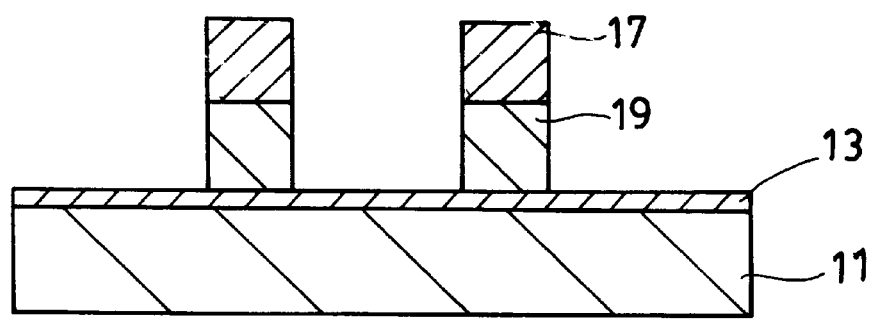
FIG. 3 is a sectional view for explaining the step following that of FIG. 2 in the production of the MOS transistor.

As shown in FIG. 3, the gate material 15 constituted as a film of polycrystalline silicon is etched using the patterned photosensitive resin 17 as an etching mask. This etching is conducted with the ECR etching machine explained earlier with reference to FIG. 1. As mentioned above, this etching falls in the category of dry etching using electron cyclotron resonance (ECR) excited by microwaves. The etching forms gates 19 in the gate material 15 portion.

After formation of the gates 19, the photosensitive resin 17 used as the etching mask is removed.

Figure 4:
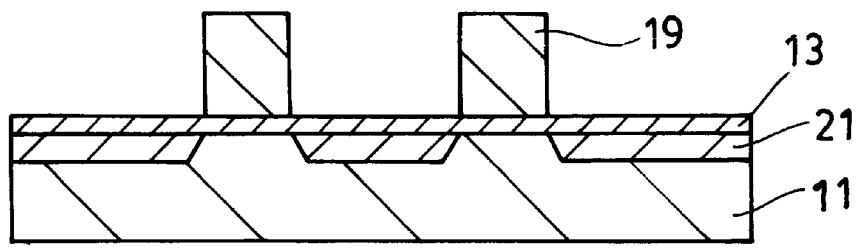
FIG. 4 is a sectional view for explaining the step following that of FIG. 3 in the production of the MOS transistor.

Next, as shown in FIG. 4, the surface of the semiconductor substrate 11 is doped with an impurity of opposite conductivity type from the semiconductor substrate 11 to form heavily doped regions 21 to constitute source and drain regions.

Figure 5:
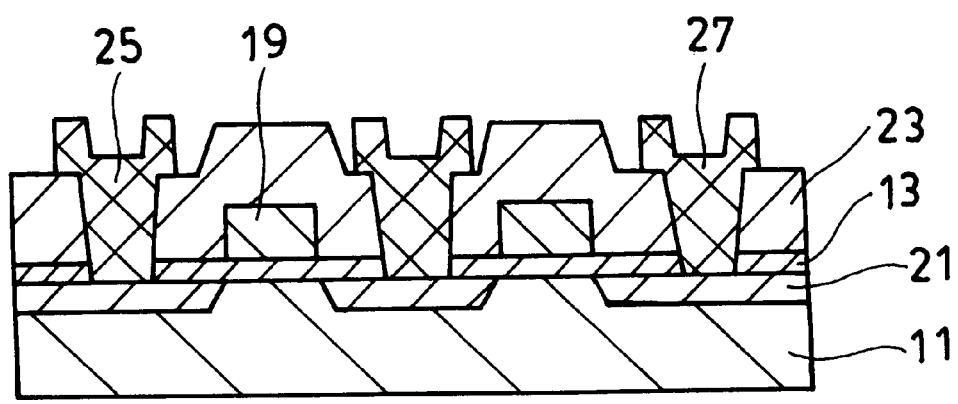
FIG. 5 is a sectional view for explaining the step following that of FIG. 4 in the production of the MOS transistor.
Figure 6:
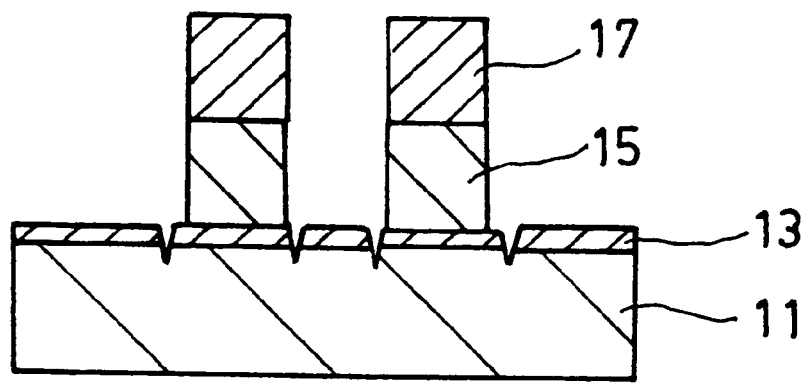
FIG. 6 is a diagram for explaining drawbacks of the prior-art dry etching method.
Figure 7:
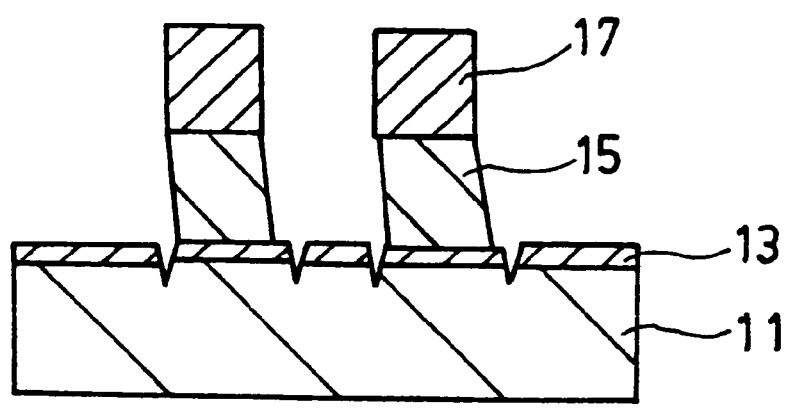
FIG. 7 is a diagram used in conjunction with FIG. 6 for explaining drawbacks of the prior-art dry etching method.
Figure 8:
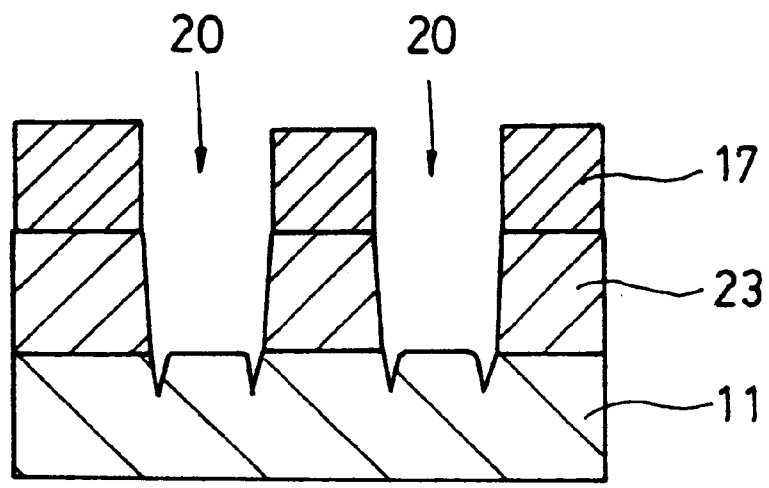
FIG. 8 is another diagram for explaining drawbacks of the prior-art dry etching method.
Figure 9:
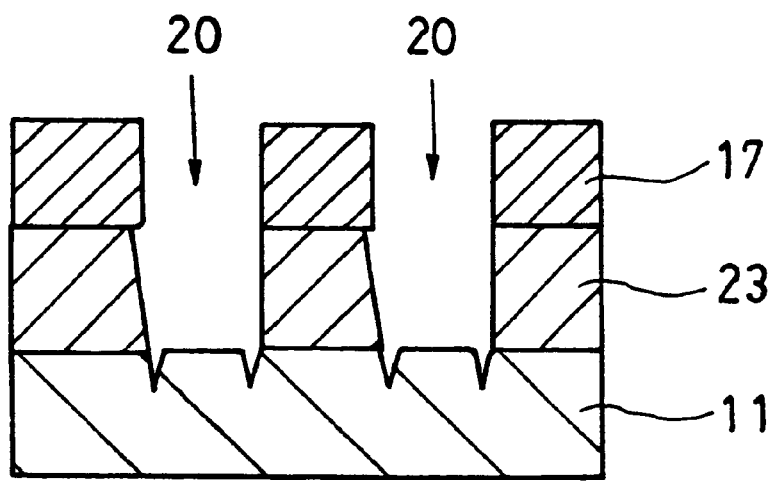
FIG. 9 is a diagram used in conjunction with FIG. 8 for explaining drawbacks of the prior-art dry etching method.

Following this, as shown in FIG. 5, an interlayer dielectric thin film 23 consisting of a silicon dioxide film containing phosphorus and boron is formed to a thickness of 550 nm by chemical vapor deposition. The whole front surface of the semiconductor substrate 11 is then coated with photosensitive resin (not shown). The photosensitive resin is exposed using a prescribed photomask and developed into a pattern for forming contact holes 25.

The interlayer dielectric thin film 23 is etched by the ECR etching machine (FIG. 1) using the patterned photosensitive resin as an etching mask, thereby forming the contact holes 25.

After formation of the contact holes 25, the photosensitive resin used as the etching mask is removed.

Next, a wiring material of aluminum alloy containing silicon and copper (not shown) is sputtered onto the front surface of the semiconductor substrate 11 to a thickness of 800 nm.

The whole front surface of the semiconductor substrate 11 is then coated with photosensitive resin (not shown). The photosensitive resin is exposed using a prescribed photomask and developed into a pattern for forming wiring 27.

The wiring material is etched by the ECR etching machine (FIG. 1) using the patterned photosensitive resin as an etching mask, thereby forming the wiring 27.

The foregoing steps fabricate a MOS transistor.

The dry etching method of this invention is used, for example, to etch the gates 19, the contact holes 25 and the wiring 27 in the aforesaid MOS transistor production process.

The gates 19 and the wiring 27 are formed by etching away the surrounding material to leave the circuit element portions concerned. This is relief pattern etching. Examples 1 to 30 of the invention set out in the following relate to etching of the gates 19. Example 61 relates to etching of the wiring 27.

The contact holes 25 are formed by etching away the material at the circuit element portion concerned from the periphery thereof. This is recessed pattern etching. Examples 31 to 60 of the invention set out in the following relate to etching of the contact holes 25.

The ECR etching machine used in the Examples is configured as explained earlier with reference to FIG. 1.

EXAMPLE 1

As shown in FIG. 2, a semiconductor substrate 11 was placed in a mixed gas atmosphere of oxygen and nitrogen and subjected to oxidation processing. This oxidation processing formed a gate insulating film 13 of silicon dioxide to a thickness of 20 nm on the surface of the semiconductor substrate 11. A gate material 15 of polycrystalline silicon was formed to a thickness of 350 nm over the whole front surface of the semiconductor substrate 11 by chemical vapor deposition employing monosilane as the reactive gas. Next, the entire front surface of the semiconductor substrate 11 was spin-coated with photosensitive resin 17. The photosensitive resin 17 was exposed through a prescribed photomask and developed to pattern it in the shape of gates.

As shown in FIG. 3, the gate material 15 constituted as a film of polycrystalline silicon was etched using the patterned photosensitive resin 17 as an etching mask, thereby forming gates 19. This etching was conducted using the ECR etching machine explained earlier with reference to FIG. 1.

Here, the semiconductor substrate 11 and the gate insulating film 13 formed on the surface thereof are non-etching layers (layers not requiring etching), while the gate material 15 is an etching layer (layer requiring etching).

The etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure in the treatment chamber 30 was set at 5 mTorr, the RF bias power from the high-frequency power source 29 at 30 W, the flow rate of the chlorine gas used as the etching gas at 90 sccm, the upper coil current at 20 A, the lower coil current at 15 A and the output power of the magnetron 41 at 100 mA.

Under the condition of a magnetron output power of 100 mA, the etching was effected mainly as anisotropic etching by ions.

The first etching step was terminated when the thickness of the gate material 15 in the etching region reached about 50 nm.

The second etching step was then conducted.

In the second etching step, the etching pressure in the treatment chamber 30 was set at 5 mTorr, the RF bias power from the high-frequency power source 29 at 30 W, the flow rate of the chlorine gas used as the etching gas at 90 sccm, the upper coil current at 20 A and the lower coil current at 15 A. These condition settings are the same as those in the first etching step.

The output power of the magnetron 41 was raised to 250 mA in the second etching step.

The isotropic etching component and the etching speed increased owing to the increase of the output power of the magnetron to 250 mA.

The second etching step was terminated when all of the gate material 15 in the etching region had been eliminated by the etching.

In order to completely eliminate the etching layer (the gate material 15 in this Example) by the second etching step, the non-etching layer (the gate insulating film 13 in this Example) is preferably etched uniformly to only a slight depth. The same is true in the Examples described hereinafter.

Changing the output power of the magnetron in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 2

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 30 A and the lower coil 47 current at 20 A so as to position the ECR point very near the semiconductor substrate 11 and enable the etching to be conducted with increased anisotropy.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA, the RF bias power at 15 W and the flow rate of the chlorine gas at 90 sccm. The upper coil 45 current was set at 20 A and the lower coil 47 current at 15 A so as to position the ECR point apart from the semiconductor substrate 11 and enable the etching to be conducted with increased uniformity and increased etching selectivity between the gate insulating film 13 and the gate material 15.

The etching selectivity is defined as the ratio (A/B) between the etching rate A of the gate material 15 and the etching rate B of the gate insulating film 13. The increased etching selectivity prevented deep local etching of the gate insulating film 13 (non-etching layer).

The second etching step was terminated when all of the gate material 15 in the etching region had been eliminated by the etching.

Changing the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 3

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 20 A and the lower coil 47 current at 20 A to obtain a uniform magnetic field intensity distribution between the ECR point and the semiconductor substrate 11. The etching was conducted under these conditions.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA, the RF bias power at 15 W and the flow rate of the chlorine gas at 90 sccm. The upper coil 45 current was set at 30 A and the lower coil 47 current at 10 A to modify the magnetic field intensity distribution between the ECR point and the semiconductor substrate 11 so as to disperse with increasing proximity to the semiconductor substrate 11, thereby enabling the etching to be conducted with increased uniformity and increased etching selectivity between the gate insulating film 13 and the gate material 15.

The second etching step was terminated when all of the gate material 15 in the etching region had been eliminated by the etching.

Changing the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 4

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W, the flow rate of the chlorine gas at 90 sccm, the upper coil 45 current at 30 A and the lower coil 47 current at 20 A.

Owing to the lower output power of the magnetron than in Example 3 and the positioning of the ECR point near the semiconductor substrate 11 in this manner, the etching anisotropy increased.

The first etching step was terminated when the thickness of the gate material 15 in the etching region reached about 50 nm.

The second etching step was then conducted.

In the second etching step, the etching pressure was set at 5 mTorr, the output power of the magnetron at 250 mA, the RF bias power at 15 W and the flow rate of the chlorine gas at 90 sccm. The upper coil 45 current was set at 20 A and the lower coil 47 current at 15 A. Thus the output power of the magnetron and the ECP point were changed.

This had the effect of enhancing the etching uniformity and increasing the etching speed.

The second etching step was terminated when all of the gate material 15 in the etching region had been eliminated by the etching.

Changing the output power of the magnetron and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 5

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W and the flow rate of the chlorine gas at 90 sccm. The upper coil 45 current was set at 20 A and the lower coil 47 current at 20 A.

The etching exhibited high anisotropy owing to the uniform magnetic field intensity distribution under these settings.

The first etching step was terminated when the thickness of the gate material 15 in the etching region reached about 50 nm.

The second etching step was then conducted.

In the second etching step, the etching pressure was set at 5 mTorr, the output power of the magnetron at 250 mA, the RF bias power at 15 W, the flow rate of the chlorine gas at 90 sccm, the upper coil 45 current at 30 A and the lower coil 47 current at 10 A. Thus the output power of the magnetron was increased and the magnetic field intensity distribution made weaker with increasing proximity to the semiconductor substrate 11.

This had the effect of enhancing the etching uniformity and increasing the etching speed.

The second etching step was terminated when all of the gate material 15 in the etching region had been eliminated by the etching.

Changing the output power of the magnetron and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 6

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W, the flow rate of the chlorine gas at 90 sccm, the upper coil 45 current at 25 A and the lower coil 47 current at 25 A.

The etching exhibited high anisotropy owing to the uniform magnetic field intensity distribution under these settings.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA, the RF bias power at 15 W, the flow rate of the chlorine gas at 90 sccm, the upper coil 45 current at 25 A and the lower coil 47 current at 10 A. Thus the ECR point was changed and the magnetic field intensity distribution made weaker with increasing proximity to the semiconductor substrate 11.

This had the effect of enhancing the etching uniformity and increasing the etching selectivity between the gate insulating film 13 and the gate material 15.

The second etching step was terminated when all of the gate material 15 in the etching region had been eliminated by the etching.

Changing the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 7

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W, the flow rate of the chlorine gas at 90 sccm, the upper coil 45 current at 25 A and the lower coil 47 current at 25 A. Under these settings, the ECR point was positioned near the semiconductor substrate 11 and the magnetic field intensity distribution was uniform.

The etching exhibited high anisotropy owing to the uniform magnetic field intensity distribution under these settings.

The first etching step was terminated when the thickness of the gate material 15 in the etching region reached about 50 nm.

The second etching step was then conducted.

In the second etching step, the etching pressure was set at 5 mTorr, the output power of the magnetron at 250 mA, the RF bias power at 15 W, the flow rate of the chlorine gas at 90 sccm, the upper coil 45 current at 25 A and the lower coil 47 current at 10 A. Thus the output power of the magnetron was elevated, the ECR point moved away from the semiconductor substrate 11 and the magnetic field intensity distribution made weaker with increasing proximity to the semiconductor substrate 11.

These settings had the effect of making the etching uniform, increasing the etching speed and enhancing the etching selectivity between the gate insulating film 13 and the gate material 15.

The second etching step was terminated when all of the gate material 15 in the etching region had been eliminated by the etching.

Changing the output power of the magnetron, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 8

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the output power of the magnetron was set at 150 mA, the RF bias power at 30 W, the flow rate of the chlorine gas at 90 sccm, the upper coil 45 current at 20 A, the lower coil 47 current at 15 A and the etching pressure at 5 mTorr.

The etching conducted under these conditions exhibited increased anisotropy.

The first etching step was terminated when the thickness of the gate material 15 in the etching region reached about 50 nm.

The second etching step was then conducted.

In the second etching step, the output power of the magnetron was set at 150 mA, the RF bias power at 30 W, the flow rate of the chlorine gas at 90 sccm, the upper coil 45 current at 20 A, the lower coil 47 current at 15 A and the etching pressure at 10 mTorr. Thus the etching pressure was increased.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 9

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the output power of the magnetron was set at 150 mA, the flow rate of the chlorine gas at 90 sccm, the upper coil 45 current at 20 A, the lower coil 47 current at 15 A and the RF bias power at 30 W. The etching pressure was set low at 5 mTorr.

The etching conducted under these conditions exhibited increased anisotropy.

The first etching step was terminated when the thickness of the gate material 15 in the etching region reached about 50 nm.

The second etching step was then conducted.

In the second etching step, the output power of the magnetron was set at 150 mA, the flow rate of the chlorine gas at 90 sccm, the upper coil 45 current at 20 A, the lower coil 47 current at 15 A, the etching pressure at 10 mTorr and the RF bias power at 15 W. Thus the etching pressure was increased and RF bias power lowered.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure and the RF bias power in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 10

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the RF bias power was at 30 W, the flow rate of the chlorine gas at 90 sccm, the upper coil 45 current at 20 A, the lower coil 47 current at 15 A, the output power of the magnetron at 100 mA, and the etching pressure at 5 mTorr.

The etching conducted under these conditions exhibited increased anisotropy.

The first etching step was terminated when the thickness of the gate material 15 in the etching region reached about 50 nm.

The second etching step was then conducted.

In the second etching step, the RF bias power was set at 30 W, the flow rate of the chlorine gas at 90 sccm, the upper coil 45 current at 20 A, the lower coil 47 current at 15 A, the etching pressure at 10 mTorr and the output power of the magnetron 250 mA. Thus the etching pressure and output power of the magnetron were increased.

These setting had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure and the output power of the magnetron in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 11

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the flow rate of the chlorine gas at 90 sccm, the upper coil 45 current at 20 A and the lower coil 47 current at 15 A, while the output power of the magnetron was set low at 100 mA and the RF bias power high at 30 W so as to elevate the anisotropy of the etching.

The first etching step was terminated when the thickness of the gate material 15 in the etching region reached about 50 nm.

The second etching step was then conducted.

In the second etching step, the etching pressure was set at 5 mTorr, the flow rate of the chlorine gas at 90 sccm, the upper coil 45 current at 20 A and the lower coil 47 current at 15 A, while RF bias power was lowered to 15 W and the output power of the magnetron was raised to 250 mA.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power and the output power of the magnetron in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 12

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the flow rate of the chlorine gas was set at 90 sccm, the upper coil 45 current at 20 A and the lower coil 47 current at 15 A, while the RF bias power was set high at 30 W, the output power of the magnetron low at 100 mA and the etching pressure low at 5 mTorr so as to elevate the isotropy of the etching.

The first etching step was terminated when the thickness of the gate material 15 in the etching region reached about 50 nm.

The second etching step was then conducted.

In the second etching step, the flow rate of the chlorine gas was set at 90 sccm, the upper coil 45 current at 20 A and the lower coil 47 current at 15 A, while the etching pressure was increased to 10 mTorr, the output power of the magnetron was raised to 250 mA and the RF bias power was lowered to 15 W.

These setting had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power and the etching pressure in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 13

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm, while the upper coil 45 current was set at 30 A and the lower coil 47 current at 20 A so as to position the ECR point very near the semiconductor substrate 11 and heighten the etching anisotropy.

The first etching step was terminated when the thickness of the gate material 15 in the etching region reached about 50 nm.

The second etching step was then conducted.

In the second etching step, the etching pressure was elevated to 10 mTorr, while the output power of the magnetron was set at 150 mA, the RF bias power at 15 W and the flow rate of the chlorine gas at 90 sccm. The upper coil 45 current was set at 20 A and the lower coil 47 current at 15 A so as to move the ECR point away from the semiconductor substrate 11.

These setting had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the ECR point and the etching pressure in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 14

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm, while the upper coil 45 current was set at 30 A and the lower coil 47 current at 20 A so as to position the ECR point very near the semiconductor substrate 11 and heighten the etching anisotropy.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA and the flow rate of the chlorine gas at 90 sccm. The RF bias power was lowered to 10 W. The upper coil 45 current was set at 20 A and the lower coil 47 current at 15 A so as to move the ECR point away from the semiconductor substrate 11.

These setting had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 15

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 30 A and the lower coil 47 current at 20 A so as to position the ECR point very near the semiconductor substrate 11 and heighten the etching anisotropy.

The first etching step was terminated when the thickness of the gate material 15 in the etching region reached about 50 nm.

The second etching step was then conducted.

In the second etching step, the etching pressure was elevated to 10 mTorr and the RF bias power was lowered to 10 W. The output power of the magnetron was set at 150 mA and the flow rate of the chlorine gas at 90 sccm. The upper coil 45 current was set at 20 A and the lower coil 47 current at 15 A so as to move the ECR point away from the semiconductor substrate 11.

These setting had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure, the RF bias power and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 16

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the gate material 15 in the etching region reached about 50 nm.

The second etching step was then conducted.

In the second etching step, the output power of the magnetron was set at 150 mA, the RF bias power at 15 W and the flow rate of the chlorine gas at 90 sccm. The etching pressure was raised to 10 mTorr, while the upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 17

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA and the flow rate of the chlorine gas at 90 sccm. The RF bias power was lowered to 10 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 18

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the gate material 15 in the etching region reached about 50 nm.

The second etching step was then conducted.

In the second etching step, the output power of the magnetron was set at 150 mA and the flow rate of the chlorine gas at 90 sccm. The etching pressure was increased to 10 mTorr and the RF bias power was lowered to 10 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power, the etching pressure and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 19

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the gate material 15 in the etching region reached about 50 nm.

The second etching step was then conducted.

In the second etching step, the RF bias power was set at 15 W and the flow rate of the chlorine gas at 90 sccm. The etching pressure was increased to 10 mTorr and the output power of the magnetron was raised to 250 mA. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the etching pressure and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 20

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the gate material 15 in the etching region reached about 50 nm.

The second etching step was then conducted.

In the second etching step, the etching pressure was set at 5 mTorr and the flow rate of the chlorine gas at 90 sccm. The output power of the magnetron was raised to 250 mA and the RF bias power was lowered to 10 W. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 21

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the gate material 15 in the etching region reached about 50 nm.

The second etching step was then conducted.

In the second etching step, the flow rate of the chlorine gas was set at 90 sccm. The etching pressure was increased to 10 mTorr, the output power of the magnetron was raised 250 mA and the RF bias power was lowered to 10 W. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power, the etching pressure and the ECR point in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 22

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the etching pressure was set at 10 mTorr, the RF bias power at 15 W and the flow rate of the chlorine gas at 90 sccm. The output power of the magnetron was raised at 250 mA. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the etching pressure and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 23

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the etching pressure was set at 5 mTorr and the flow rate of the chlorine gas at 90 sccm. The output power of the magnetron was raised to 250 mA and the RF bias power was lowered to 10 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 24

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the RF bias power at 15 W and the flow rate of the chlorine gas at 90 sccm. The output power of the magnetron was set low at 100 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the flow rate of the chlorine gas was set at 90 sccm. The etching pressure was increased to 10 mTorr, the output power of the magnetron was raised to 250 mA and the RF bias power was lowered to 10 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power, the etching pressure and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 25

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the output power of the magnetron was set at 150 mA, the RF bias power at 15 W and the flow rate of the chlorine gas at 90 sccm. The etching pressure was raised to 10 mTorr. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the etching pressure, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 26

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the etching pressure was set at 5 mTorr, the output power of the magnetron at 150 mA and the flow rate of the chlorine gas at 90 sccm. The RF bias power was lowered to 10 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 27

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 150 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the output power of the magnetron was set at 150 mA and the flow rate of the chlorine gas at 90 sccm. The etching pressure was raised to 10 mTorr and the RF bias power was lowered to 10 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the RF bias power, the etching pressure, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 28

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the RF bias power was set at 15 W and the flow rate of the chlorine gas at 90 sccm. The etching pressure was increased to 10 mTorr and the output power of the magnetron was raised to 250 mA. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the etching pressure, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 29

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the etching pressure was set at 5 mTorr and the flow rate of the chlorine gas at 90 sccm. The output power of the magnetron was raised to 250 mA and the RF bias power was lowered to 10 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 30

As in Example 1, the etching process for formation of the gates 19 was effected by a first etching step in which etching was conducted to just before reaching the surface of the non-etching layer, i.e., the surface of the gate insulating film 13, and a separate second etching step conducted thereafter, with the conditions set for the etching being changed between the two steps as follows.

In the first etching step, the etching pressure was set at 5 mTorr, the output power of the magnetron at 100 mA, the RF bias power at 15 W and the flow rate of the chlorine gas at 90 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the gate material 15 in the etching region reached about 50 nm.

The second etching step was then conducted.

In the second etching step, the flow rate of the chlorine gas was set at 90 sccm. The etching pressure was increased to 10 mTorr, the output power of the magnetron was raised to 250 mA and the RF bias power was lowered to 10 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the gate insulating film 13 and the gate material 15.

The second etching step was terminated when all of the gate material 15 in the etching region had been eliminated by the etching.

Changing the output power of the magnetron, the RF bias power, the etching pressure, the ECR point and the magnetic field intensity distribution in the foregoing manner enabled formation of gates 19 that did not differ in shape between the middle and peripheral regions of the semiconductor substrate 11 and prevented deep local etching of the semiconductor substrate 11 and the gate insulating film 13.

EXAMPLE 31

After the gates 19 had been formed in the manner of Examples 1–30, the photosensitive resin 17 used as the etching mask was removed.

Next, as shown in FIG. 4, the surface of the semiconductor substrate 11 was doped with an impurity of opposite conductivity type from the semiconductor substrate 11 to form heavily doped regions 21 to constitute source and drain regions.

Following this, as shown in FIG. 5, an interlayer dielectric thin film 23 consisting of a silicon dioxide film containing phosphorus and boron was formed to a thickness of 550 nm by chemical vapor deposition. The whole front surface of the semiconductor substrate 11 was then coated with photosensitive resin (not shown). The photosensitive resin was exposed using a prescribed photo mask and developed into a pattern for forming contact holes 25.

The interlayer dielectric thin film 23 was etched by the ECR etching machine (FIG. 1) using the patterned photosensitive resin as an etching mask, thereby forming the contact holes 25.

This Example to Example 60 of the invention relate to etching of the contact holes 25.

In these Examples, the semiconductor substrate 11 and the heavily doped regions 21 formed by doping the surface thereof with impurity are non-etching layers (layers not requiring etching), while the interlayer dielectric thin film 23 is an etching layer (layer requiring etching).

The etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure in the treatment chamber 30 was set at 5 mTorr, the RF bias power from the high-frequency power source 29 at 150 W, the flow rate of the trifluoromethane gas used as etching gas at 49 sccm, the flow rate of the difluoromethane gas used as etching gas at 21 sccm, the upper coil current at 21 A, the lower coil current at 5 A and the output power of the magnetron 41 at 300 mA.

Under the condition of a magnetron output power of 300 mA, the etching was effected mainly as anisotropic etching by ions.

The first etching step was terminated when the thickness of the interlayer dielectric thin film 23 in the etching region reached about 50 nm.

The second etching step was then conducted.

In the second etching step, the etching pressure in the treatment chamber 30 was set at 5 mTorr, the RF bias power from the high-frequency power source 29 at 150 W, the flow rate of the trifluoromethane gas used as etching gas at 49 sccm, the flow rate of the difluoromethane gas used as etching gas at 21 sccm, the upper coil current at 21 A and the lower coil current at 5 A. These condition settings are the same as those in the first etching step.

The output power of the magnetron 41 was raised to 500 mA in the second etching step.

The isotropic etching component and the etching speed increased owing to the increase of the output power of the magnetron to 500 mA.

The second etching step was terminated when all of the interlayer dielectric thin film 23 in the etching region had been eliminated by the etching.

Changing the output power of the magnetron in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 32

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 30 A and the lower coil 47 current at 20 A so as to position the ECR point very near the semiconductor substrate 11 and heighten the etching anisotropy. The etching was conducted under these conditions.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, the upper coil 45 current at 21 A and the lower coil 47 current at 5 A, so as to move the ECR point away from the semiconductor substrate 11 and enable the etching to be conducted with enhanced etching uniformity and increased etching selectivity between the semiconductor substrate 11 and the interlayer dielectric thin film 23.

The etching selectivity is defined as the ratio (A/B) between the etching rate A of the interlayer dielectric thin film 23 and the etching rate B of the semiconductor substrate 11. The increased etching selectivity prevented deep local etching of the semiconductor substrate 11 (non-etching layer).

The second etching step was terminated when all of the interlayer dielectric thin film 23 in the etching region had been eliminated by the etching.

Changing the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 33

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 20 A and the lower coil 47 current at 20 A to obtain a uniform magnetic field intensity distribution between the ECR point and the semiconductor substrate 11. The etching was conducted under these conditions.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, the upper coil 45 current at 30 A and the lower coil 47 current at 10 A. As a result, the magnetic field intensity distribution between the ECR point and the semiconductor substrate 11 was modified so as to disperse with increasing proximity to the semiconductor substrate 11, thereby enabling the etching to be conducted with increased uniformity and increased etching selectivity between the semiconductor substrate 11 and the interlayer dielectric thin film 23.

The second etching step was terminated when all of the interlayer dielectric thin film 23 in the etching region had been eliminated by the etching.

Changing the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 34

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm, the flow rate of the difluoromethane gas at 21 sccm, the upper coil 45 current at 30 A and the lower coil 47 current at 20 A.

Owing to the lower output power of the magnetron than in Example 33 and the positioning the ECR point near the semiconductor substrate 11 in this manner, the etching anisotropy increased.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 500 mA, the RF bias power at 100 W, the flow rate of the trifluoromethane gas at 49 sccm, the flow rate of the difluoromethane gas at 21 sccm, the upper coil 45 current at 20 A and the lower coil 47 current at 15 A. Thus the output power of the magnetron and the ECR point were changed.

This had the effect of enhancing the etching uniformity and increasing the etching speed.

The second etching step was terminated when all of the interlayer dielectric thin film 23 in the etching region had been eliminated by the etching.

Changing the output power of the magnetron and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 35

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm, the flow rate of the difluoromethane gas at 21 sccm, the upper coil 45 current at 20 A and the lower coil 47 current at 20 A.

The etching exhibited high anisotropy owing to the uniform magnetic field intensity distribution under these settings.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 500 mA, the RF bias power at 100 W, the flow rate of the trifluoromethane gas at 49 sccm, the flow rate of the difluoromethane gas at 21 sccm, the upper coil 45 current at 30 A and the lower coil 47 current at 10 A. Thus the output power of the magnetron was increased and the magnetic field intensity distribution made weaker with increasing proximity to the semiconductor substrate 11.

This had the effect of enhancing the etching uniformity and increasing the etching speed.

The second etching step was terminated when all of the interlayer dielectric thin film 23 in the etching region had been eliminated by the etching.

Changing the output power of the magnetron and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 36

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, the upper coil 45 current at 25 A and the lower coil 47 current at 25 A.

The etching exhibited high anisotropy owing to the uniform magnetic field intensity distribution under these settings.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, the upper coil 45 current at 25 A and the lower coil 47 current at 10 A. Thus the ECR point was changed and the magnetic field intensity distribution made weaker with increasing proximity to the semiconductor substrate 11.

This had the effect of enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 37

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm, the flow rate of the difluoromethane gas at 21 sccm, the upper coil 45 current at 25 A and the lower coil 47 current at 25 A. Under these settings, the ECR point was positioned near the semiconductor substrate 11 and the magnetic field intensity distribution was uniform.

The etching exhibited high anisotropy owing to the uniform magnetic field intensity distribution under these settings.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 500 mA, the RF bias power at 100 W, the flow rate of the trifluoromethane gas at 49 sccm, the flow rate of the difluoromethane gas at 21 sccm, the upper coil 45 current at 25 A and the lower coil 47 current at 10 A. Thus the output power of the magnetron was elevated, the ECR point was moved away from the semiconductor substrate 11 and the magnetic field intensity distribution made weaker with increasing proximity to the semiconductor substrate 11.

These settings had the effect of making the etching uniform, increasing the etching speed and enhancing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 38

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the output power of the magnetron was set at 400 mA, the RF bias power at 150 W, the flow rate of the trifluoromethane gas at 49 sccm, the flow rate of the difluoromethane gas at 21 sccm, the upper coil 45 current at 21 A, the lower coil 47 current at 5 A and the etching pressure at 5 mTorr.

The etching exhibited high anisotropy under these settings.

The first etching step was terminated when the thickness of the interlayer dielectric thin film 23 in the etching region reached about 50 nm.

The second etching step was then conducted.

In the second etching step, the output power of the magnetron was set at 400 mA, the RF bias power at 150 W, the flow rate of the trifluoromethane gas at 49 sccm, the flow rate of the difluoromethane gas at 21 sccm, the upper coil 45 current at 21 A, the lower coil 47 current at 5 A and the etching pressure at 10 mTorr. Thus the etching pressure was increased.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 39

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the output power of the magnetron was set at 400 mA, the flow rate of the trifluoromethane gas at 49 sccm, the flow rate of the difluoromethane gas at 21 sccm, the upper coil 45 current at 21 A, the lower coil 47 current at 5 A and the RF bias power at 150 W. The etching pressure was set low at 5 mTorr.

The etching exhibited high anisotropy under these settings.

The first etching step was terminated when the thickness of the interlayer dielectric thin film 23 in the etching region reached about 50 nm.

The second etching step was then conducted.

In the second etching step, the output power of the magnetron was set at 400 mA, the flow rate of the trifluoromethane gas at 49 sccm, the flow rate of the difluoromethane gas at 21 sccm, the upper coil 45 current at 21 A, the lower coil 47 current at 5 A, the etching pressure at 10 mTorr and the RF bias power at 100 W. Thus the etching pressure was increased and RF bias power lowered.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure and the RF bias power in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 40

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the RF bias power was set at 150 W, the flow rate of the trifluoromethane gas at 49 sccm, the flow rate of the difluoromethane gas at 21 sccm, the upper coil 45 current at 21 A, the lower coil 47 current at 5 A, the output power of the magnetron at 300 mA and the etching pressure at 5 mTorr.

The etching exhibited high anisotropy under these settings.

The first etching step was terminated when the thickness of the interlayer dielectric thin film 23 in the etching region reached about 50 nm.

The second etching step was then conducted.

In the second etching step, the RF bias power was set at 150 W, the flow rate of the trifluoromethane gas at 49 sccm, the flow rate of the difluoromethane gas at 21 sccm, the upper coil 45 current at 21 A, the lower coil 47 current at 5 A, the etching pressure at 10 mTorr and the output power of the magnetron at 500 mA. Thus the etching pressure and output power of the magnetron were increased.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure and the output power of the magnetron in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 41

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the flow rate of the trifluoromethane gas at 49 sccm, the flow rate of the difluoromethane gas at 21 sccm, the upper coil 45 current at 21 A and the lower coil 47 current at 5 A, while the output power of the magnetron was set low at 300 mA and the RF bias power high at 150 W so as to elevate the anisotropy of the etching.

The first etching step was terminated when the thickness of the interlayer dielectric thin film 23 in the etching region reached about 50 nm.

The second etching step was then conducted.

In the second etching step, the etching pressure was set at 5 mTorr, the flow rate of the trifluoromethane gas at 49 sccm, the flow rate of the difluoromethane gas at 21 sccm, the upper coil 45 current at 21 A and the lower coil 47 current at 5 A, while RF bias power was lowered to 100 W and the output power of the magnetron was raised to 500 mA.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power and the output power of the magnetron in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 42

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the flow rate of the trifluoromethane gas was set at 49 sccm, the flow rate of the difluoromethane gas at 21 sccm, the upper coil 45 current at 21 A and the lower coil 47 current at 5 A, while the RF bias power was set high at 150 W, the output power of the magnetron was set low at 300 mA and the etching pressure was set low at 5 mTorr so as to elevate the anisotropy of the etching.

The first etching step was terminated when the thickness of the interlayer dielectric thin film 23 in the etching region reached about 50 nm.

The second etching step was then conducted.

In the second etching step, the flow rate of the trifluoromethane gas was set at 49 sccm, the flow rate of the difluoromethane gas at 21 sccm, the upper coil 45 current at 21 A and the lower coil 47 current at 5 A, while the etching pressure was increased to 10 mTorr, the output power of the magnetron was raised to 500 mA and the RF bias power was lowered to 100 W.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power and the etching pressure in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 43

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, while the upper coil 45 current was set at 30 A and the lower coil 47 current at 20 A so as to position the ECR point very near the semiconductor substrate 11 and heighten the etching anisotropy.

The first etching step was terminated when the thickness of the interlayer dielectric thin film 23 in the etching region reached about 50 nm.

The second etching step was then conducted.

In the second etching step, the etching pressure was increased to 10 mTorr, while the output power of the magnetron was set at 400 mA, the RF bias power at 100 W, the flow rate of the trifluoromethane gas at 49 sccm and the flow rate of the difluoromethane gas at 21 sccm. The upper coil 45 current was set at 21 A and the lower coil 47 current at 5 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the ECR point and the etching pressure in the foregoing manner enabled formation of contact holes that did not differ in shape between the middle and peripheral regions of the semiconductor substrate 11 and prevented deep local etching of the semiconductor substrate 11 and the heavily doped regions 21.

EXAMPLE 44

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm, the flow rate of the difluoromethane gas at 21 sccm, while the upper coil 45 current was set at 30 A and the lower coil 47 current at 20 A so as to position the ECR point very near the semiconductor substrate 11 and heighten the etching anisotropy.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the flow rate of the trifluoromethane gas at 49 sccm and the flow rate of the difluoromethane gas at 21 sccm. The RF bias power was lowered to 80 W. The upper coil 45 current was set at 21 A and the lower coil 47 current at 5 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 45

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 30 A and the lower coil 47 current at 20 A so as to position the ECR point very near the semiconductor substrate 11 and heighten the etching anisotropy.

The first etching step was terminated when the thickness of the interlayer dielectric thin film 23 in the etching region reached about 50 nm.

The second etching step was then conducted.

In the second etching step, the etching pressure was elevated to 10 mTorr and the RF bias power was lowered to 80 W. The output power of the magnetron was set at 400 mA, the flow rate of the trifluoromethane gas at 49 sccm and the flow rate of the difluoromethane gas at 21 sccm. The upper coil 45 current was set at 21 A and the lower coil 47 current at 5 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure, the RF bias power and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 46

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the interlayer dielectric thin film 23 in the etching region reached about 50 nm.

The second etching step was then conducted.

In the second etching step, the output power of the magnetron was set at 400 mA, the RF bias power at 100 W, the flow rate of the trifluoromethane gas at 49 sccm and the flow rate of the difluoromethane gas at 21 sccm. The etching pressure was raised to 10 mTorr, while the upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 47

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the flow rate of the trifluoromethane gas at 49 sccm and the flow rate of the difluoromethane gas at 21 sccm. The RF bias power was lowered to 80 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power and the magnetic field intensity distribution etching pressure and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 48

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 20 A and the lower coil 47 current at 20 A to obtain a uniform magnetic field intensity distribution between the ECR point and the semiconductor substrate 11 and thereby heighten the anisotropy of the etching.

The first etching step was terminated when the thickness of the interlayer dielectric thin film 23 in the etching region reached about 50 nm.

The second etching step was then conducted.

In the second etching step, the output power of the magnetron was set at 400 mA, the flow rate of the trifluoromethane gas at 49 sccm and the flow rate of the difluoromethane gas at 21 sccm. The etching pressure was increased to 10 mTorr and the RF bias power was lowered to 80 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power, the etching pressure and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 49

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the interlayer dielectric thin film 23 in the etching region reached about 50 nm.

The second etching step was then conducted.

In the second etching step, the RF bias power was set at 100 W, the flow rate of the trifluoromethane gas at 49 sccm and the flow rate of the difluoromethane gas at 21 sccm. The etching pressure was raised to 10 mTorr and the output power of the magnetron was raised to 500 mA. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the etching pressure and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 50

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the interlayer dielectric thin film 23 in the etching region reached about 50 nm.

The second etching step was then conducted.

In the second etching step, the etching pressure was set at 5 mTorr, the flow rate of the trifluoromethane gas at 49 sccm and the flow rate of the difluoromethane gas at 21 sccm. The output power of the magnetron was raised to 500 mA and the RF bias power was lowered to 80 W. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 51

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 30 A and the lower coil 47 current at 20 A to position the ECR point near the semiconductor substrate 11.

The etching exhibited high anisotropy under these settings.

The first etching step was terminated when the thickness of the interlayer dielectric thin film 23 in the etching region reached about 50 nm.

The second etching step was then conducted.

In the second etching step, the flow rate of the trifluoromethane gas was set at 49 sccm and the flow rate of the difluoromethane gas at 21 sccm. The etching pressure was increased to 10 mTorr, the output power of the magnetron was raised to 500 mA and the RF bias power was lowered to 80 W. The upper coil 45 current was set at 20 A and the lower coil 47 current at 15 A so as to move the ECR point away from the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power, the etching pressure and the ECR point in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 52

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the etching pressure was set at 10 mTorr, the RF bias power at 100 W, the flow rate of the trifluoromethane gas at 49 sccm and the flow rate of the difluoromethane gas at 21 sccm. The output power of the magnetron was raised to 500 mA. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the etching pressure and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 53

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the etching pressure was set at 5 mTorr, the flow rate of the trifluoromethane gas at 49 sccm and the flow rate of the difluoromethane gas at 21 sccm. The output power of the magnetron was raised to 500 mA and the RF bias power was lowered to 80 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 54

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the RF bias power at 100 W, the flow rate of the trifluoromethane gas at 49 sccm and the flow rate of the difluoromethane gas at 21 sccm. The output power of the magnetron was set low at 300 mA. The upper coil 45 current was set at 20 A and the lower coil 47 current at 20 A to obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the flow rate of the trifluoromethane gas was set at 49 sccm and the flow rate of the difluoromethane gas at 21 sccm. The etching pressure was raised to 10 mTorr, the output power of the magnetron was raised to 500 mA and the RF bias power was lowered to 80 W. The upper coil 45 current was set at 30 A and the lower coil 47 current at 10 A to make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power, the etching pressure and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 55

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the output power of the magnetron was set at 400 mA, the RF bias power at 100 W, the flow rate of the trifluoromethane gas at 49 sccm and the flow rate of the difluoromethane gas at 21 sccm. The etching pressure was raised to 10 mTorr. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the etching pressure, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 56

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the etching pressure was set at 5 mTorr, the output power of the magnetron at 400 mA, the flow rate of the trifluoromethane gas at 49 sccm and the flow rate of the difluoromethane gas at 21 sccm. The RF bias power was lowered to 80 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 57

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 400 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the output power of the magnetron was set at 400 mA, the flow rate of the trifluoromethane gas at 49 sccm and the flow rate of the difluoromethane gas at 21 sccm. The etching pressure was raised to 10 mTorr and the RF bias power was lowered to 80 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the RF bias power, the etching pressure, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 58

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the RF bias power was set at 100 W, the flow rate of the trifluoromethane gas at 49 sccm and the flow rate of the difluoromethane gas at 21 sccm. The etching pressure was increased to 10 mTorr and the output power of the magnetron was raised to 500 mA. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the etching pressure, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 59

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the etching pressure was set at 5 mTorr, the flow rate of the trifluoromethane gas at 49 sccm and the flow rate of the difluoromethane gas at 21 sccm. The output power of the magnetron was raised to 500 mA and the RF bias power was lowered to 80 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 60

As in Example 31, the etching process for formation of the contact holes 25 was effected by a first etching step in which etching was conducted to just before reaching the surface of the non-etching layer, i.e., the heavily doped regions 21, and a separate second etching step conducted thereafter, with the conditions set for the etching being changed between the two steps as follows.

In the first etching step, the etching pressure was set at 5 mTorr, the output power of the magnetron at 300 mA, the RF bias power at 100 W, the flow rate of the trifluoromethane gas at 49 sccm and the flow rate of the difluoromethane gas at 21 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the interlayer dielectric thin film 23 in the etching region reached about 50 nm.

The second etching step was then conducted.

In the second etching step, the flow rate of the trifluoromethane gas was set at 49 sccm and the flow rate of the difluoromethane gas at 21 sccm. The etching pressure was increased to 10 mTorr, the output power of the magnetron was raised to 500 mA and the RF bias power was lowered to 80 W. The upper coil 45 current was set at 25 A and the lower coil 47 current at 10 A so as to move the ECR point away from the semiconductor substrate 11 and make the magnetic field intensity distribution weaker with increasing proximity to the semiconductor substrate 11.

These settings had the effect of increasing the component of isotropic etching by radicals, enhancing the etching uniformity and increasing the etching selectivity between the semiconductor substrate 11 and the interlayer dielectric thin film 23.

The second etching step was terminated when all of the interlayer dielectric thin film 23 in the etching region had been eliminated by the etching.

Changing the output power of the magnetron, the RF bias power, the etching pressure, the ECR point and the magnetic field intensity distribution in the foregoing manner enabled formation of contact holes 25 that did not differ in shape between the middle and peripheral regions of the semiconductor substrate 11 and prevented deep local etching of the semiconductor substrate 11 and the heavily doped regions 21.

EXAMPLE 61

After formation of the contact holes 25 in the manner of Examples 31–60, the photosensitive resin used as the etching mask was removed.

Next, a wiring material of aluminum alloy containing silicon and copper (not shown) was sputtered onto the front surface of the semiconductor substrate 11 to a thickness of 800 nm.

The whole front surface of the semiconductor substrate 11 was then coated with photosensitive resin (not shown). The photosensitive resin was exposed using a prescribed photomask and developed into a pattern for forming wiring 27.

The wiring material was etched by the ECR etching machine (FIG. 1) using the patterned photosensitive resin as an etching mask, thereby forming the wiring 27.

This Example of the invention relates to etching of the wiring 27.

In this Example, the interlayer dielectric thin film 23 is a non-etching layer (layer not requiring etching), while the wiring material (not shown) is an etching layer (layer requiring etching).

The etching process for formation of the wiring 27 was effected by a first etching step in which etching was conducted to just before reaching the surface of the non-etching layer, i.e., the interlayer dielectric thin film 23, and a separate second etching step conducted thereafter, with the conditions set for the etching being changed between the two steps as follows.

In the first etching step, the etching pressure was set at 8 mTorr, the output power of the magnetron at 200 mA, the RF bias power at 50 W, the flow rate of chlorine gas used as an etching gas at 70 sccm and the flow rate of boron trichloride gas used as an etching gas at 10 sccm. The upper coil 45 current was set at 25 A and the lower coil 47 current at 25 A to position the ECR point near the semiconductor substrate 11 and obtain a uniform magnetic field intensity distribution.

The etching exhibited high anisotropy under these settings.

The first etching step was terminated when the thickness of the wiring material in the etching region reached about 50 nm.

The second etching step was then conducted.

In the second etching step, the etching pressure was set at 12 mTorr, the output power of the magnetron at 500 mA, the RF bias power at 30 W, the flow rate of the chlorine gas at 70 sccm, the flow rate of the boron trichloride gas at 10 sccm, the upper coil 45 current at 25 A and the lower coil 47 current at 11 A.

Increasing the etching pressure and changing the output power of the magnetron, the ECR point and the magnetic field intensity distribution in the foregoing manner increased the etching uniformity and the etching speed, while lowering the RF bias power enhanced the etching selectivity between the wiring material and the interlayer dielectric thin film 23.

The second etching step was terminated when all of the wiring material in the etching region had been eliminated by the etching.

Changing the output power of the magnetron, the RF bias power, the etching pressure, the ECR point and the magnetic field intensity distribution in the foregoing manner enabled formation of wiring 27 that did not differ in shape between the middle and peripheral regions of the semiconductor substrate 11 and prevented deep local etching of the interlayer dielectric thin film 23.

While the foregoing Examples explain the application of the dry etching method of the invention to the formation of gates 19, contact holes 25 and wiring 27 in a MOS transistor, this invention is not limited to the application in these examples. It can also be applied, for example, to the etching of bipolar transistor contact holes and wiring.

Although the foregoing Examples explain the application of the method of this invention to the dry etching of an interlayer dielectric thin film 23 consisting of silicon dioxide film containing phosphorus and boron, the dry etching method of this invention can also be applied to the etching of an interlayer dielectric thin film 23 consisting of silicon dioxide film containing phosphorus, silicon dioxide film containing boron, silicon dioxide film, silicon nitride film and the like.

Although the foregoing Examples explain the application of the method of this invention to the dry etching of a wiring material 27 consisting of an aluminum film containing silicon and copper, the dry etching method of this invention can also be applied to the etching of wiring 27 consisting of aluminum film containing silicon, aluminum film and the like.

The numerical values set out in the Examples are given only by way of illustration and should not be construed as limiting the scope of the invention in any way.

What is claimed is:

1. A dry etching method wherein an object to be etched consisting of a layer not requiring etching (non-etching layer) and a layer requiring etching (etching layer) formed on the non-etching layer is placed in a sealed treatment chamber, etching gas is supplied into the treatment chamber, a pressure of the treatment chamber is controlled, plasma is generated in the treatment chamber by use of microwaves, electron cyclotron resonance is produced by synergistic interaction between a magnetic field and the microwaves, a high-frequency bias power is applied to a rear surface of the object to be etched, and a front surface of the object is progressively etched in this state, the method comprising:

a first etching step using a first intensity of the microwave for etching a region which extends to a vicinity of a boundary between the non-etching layer and the etching layer but does not reach the non-etching layer; and a second etching step using a second intensity of the microwave stronger than said first intensity conducted after the first etching step for etching the etching layer until the etching layer is sufficiently removed.

2. A dry etching method according to claim 1, wherein an electron cyclotron resonance point to the object to be etched that is used in the second etching step is farther apart from the object than the electron resonance point used in the first etching step.

3. A dry etching method according to claim 2, wherein a magnetic field intensity distribution from the electron cyclotron resonance point to the object to be etched that is used in the second etching step is larger than a magnetic field intensity distribution used in the first etching step.

4. A dry etching method according to claim 1, wherein a magnetic field intensity distribution from an electron cyclotron resonance point to the object to be etched that is used in the second etching step is larger than a magnetic field intensity distribution used in the first etching step.

5. A dry etching method according to claim 1, wherein the pressure of the treatment chamber used in the second etching step is higher than the pressure of the treatment chamber used in the first etching step.

6. A dry etching method according to claim 5, wherein an electron cyclotron resonance point to the object to be etched that is used in the second etching step is farther apart from the object than an electron resonance point used in the first etching step.

7. A dry etching method according to claim 6, herein a magnetic field intensity distribution from the electron cyclotron resonance point to the object to be etched that is used in the second etching step is larger than a magnetic field intensity distribution used in the first etching step.

8. A dry etching method according to claim 5, wherein a magnetic field intensity distribution from an electron cyclotron resonance point to the object to be etched that is used in the second etching step is larger than a magnetic field intensity distribution used in the first etching step.

9. A dry etching method according to claim 1, wherein the high-frequency bias power used in the second etching step is lower than the high-frequency bias power used in the first etching step.

10. A dry etching method according to claim 9, wherein the pressure of the treatment chamber used in the second etching step is higher than the pressure of the treatment chamber used in the first etching step.

11. A dry etching method according to claim 10, wherein a magnetic field intensity distribution from an electron cyclotron resonance point to the object to be etched that is used in the second etching step is larger than a magnetic field intensity distribution used in the first etching step.

12. A dry etching method according to claim 9, wherein an electron cyclotron resonance point to the object to be etched that is used in the second etching step is farther apart from the obiect than an electron resonance point used in the first etching step.

13. A dry etching method according to claim 12, wherein the pressure of the treatment chamber used in the second etching step is higher than the pressure of the treatment chamber used in the first etching step.

14. A dry etching method according to claim 12, wherein a magnetic field intensity distribution from the electron cyclotron resonance point to the object to be etched that is used in the second etching step is larger than a magnetic field intensity distribution used in the first etching step.

15. A dry etching method according to claim 14, wherein the pressure of the treatment chamber used in the second etching step is higher than the pressure of the treatment chamber used in the first etching step.

16. A dry etching method according to claim 9, wherein a magnetic field intensity distribution from an electron cyclotron resonance point to the object to be etched that is used in the second etching step is larger than a magnetic field intensity distribution used in the first etching step.

17. A dry etching method wherein an object to be etched consisting of a layer not requiring etching (non-etching layer) and a layer requiring etching (etching layer) formed on the non-etching layer is placed in a sealed treatment chamber, etching gas is supplied into the treatment chamber, a pressure of the treatment chamber is controlled, plasma is generated in the treatment chamber by use of microwaves, electron cyclotron resonance is produced by synergistic interaction between a magnetic field and the microwaves, a high-frequency bias power is applied to a rear surface of the object to be etched, and a front surface of the object is progressively etched in this state, the method comprising:

a first etching step using a first electron cyclotron resonance point for etching a region which extends to a vicinity of a boundary between the non-etching layer and the etching layer but does not reach the non-etching layer; and a second etching step using a second electron cyclotron resonance point farther apart from the object than said first cyclotron resonance point conducted after the first etching step for etching the etching layer until the etching layer is sufficiently removed.

18. A dry etching method according to claim 17, wherein a magnetic field intensity distribution from the electron cyclotron resonance point to the object to be etched that is used in the second etching step is larger than a magnetic field intensity distribution used in the first etching step.

19. A dry etching method according to claim 17, wherein the pressure of the treatment chamber used in the second etching step is higher than the pressure of the treatment chamber used in the first etching step.

20. A dry etching method according to claim 19, wherein a magnetic field intensity distribution from the electron cyclotron resonance point to the object to be etched that is used in the second etching step is larger than a magnetic field intensity distribution used in the first etching step.

21. A dry etching method according to claim 17, wherein the high-frequency bias power used in the second etching step is lower than the high-frequency bias power used in the first etching step.

22. A dry etching method according to claim 21, wherein the pressure of the treatment chamber used in the second etching step is higher than the pressure of the treatment chamber used in the first etching step.

23. A dry etching method according to claim 22, wherein a magnetic field intensity distribution from the electron cyclotron resonance point to the object to be etched that is used in the second etching step is larger than a magnetic field intensity distribution used in the first etching step.

24. A dry etching method according to claim 21, wherein a magnetic field intensity distribution from the electron cyclotron resonance point to the object to be etched that is used in the second etching step is larger than a magnetic field intensity distribution used in the first etching step.

25. A dry etching method wherein an object to be etched consisting of a layer not requiring etching (non-etching layer) and a layer requiring etching (etching layer) formed on the non-etching layer is placed in a sealed treatment chamber, etching gas is supplied into the treatment chamber, a pressure of the treatment chamber is controlled, plasma is generated in the treatment chamber by use of microwaves, electron cyclotron resonance is produced by synergistic interaction between a magnetic field and the microwaves, a high-frequency bias power is applied to a rear surface of the object to be etched, and a front surface of the object is progressively etched in this state, the method comprising:

a first etching step using a first magnetic field intensity distribution from the electron cyclotron resonance point to the object to be etched for etching a region which extends to a vicinity of a boundary between the non-etching layer and the etching layer but does not reach the non-etching layer; and a second etching step using a second magnetic field intensity distribution from the electron cyclotron resonance point to the object to be etched that is larger than said first magnetic field intensity distribution, conducted after the first etching step for etching the etching layer until the etching layer is sufficiently removed.

26. A dry etching method according to claim 25, wherein the pressure of the treatment chamber used in the second etching step is higher than the pressure of the treatment chamber used in the first etching step.

27. A dry etching method according to claim 25, wherein the high-frequency bias power used in the second etching step is lower than the high-frequency bias power used in the first etching step.

28. A dry etching method according to claim 27, wherein the pressure of the treatment chamber used in the second etching step is higher than the pressure of the treatment chamber used in the first etching step.

* * * * *